(12) United States Patent
Yen et al.

(10) Patent No.: US 10,871,722 B2
(45) Date of Patent: Dec. 22, 2020

(54) PHOTOMASK PURGING SYSTEM AND METHOD

(71) Applicant: TAIWAN SEMICONDUCTOR MANUFACTURING CO., LTD., Hsinchu (TW)

(72) Inventors: Chung-Yi Yen, Taichung (TW); Mei-Tsu Lai, Taichung (TW); Chen-Hung Lin, Taichung (TW); Chien-Chou Ke, Tainan (TW); You-Cheng Yeh, Taichung (TW); Tai-Hsiang Lin, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/200,291

(22) Filed: Nov. 26, 2018

(65) Prior Publication Data
US 2020/0019075 A1    Jan. 16, 2020

Related U.S. Application Data

(60) Provisional application No. 62/698,298, filed on Jul. 16, 2018.

(51) Int. Cl.
*G03F 7/20* (2006.01)
(52) U.S. Cl.
CPC ...... *G03F 7/70933* (2013.01); *G03F 7/70983* (2013.01)

(58) Field of Classification Search
CPC .... G03F 7/70933; G03F 7/70983; G03F 1/82; G03F 7/70741; G03F 7/70925
See application file for complete search history.

(56) References Cited

U.S. PATENT DOCUMENTS

| | | | |
|---|---|---|---|
| 6,327,021 B1 * | 12/2001 | Higashiguchi | G03F 1/82 355/30 |
| 6,542,220 B1 * | 4/2003 | Schrijver | G03F 7/70716 355/53 |
| 9,889,477 B2 | 2/2018 | Lu et al. | |
| 2002/0074635 A1 * | 6/2002 | Hattori | H01L 21/67386 257/678 |
| 2006/0011213 A1 * | 1/2006 | Moriya | H01L 21/67742 134/1.1 |

(Continued)

FOREIGN PATENT DOCUMENTS

| | | |
|---|---|---|
| CN | 201122229 Y | 9/2008 |
| CN | 106468855 A | 3/2017 |

(Continued)

OTHER PUBLICATIONS

Machine translation of JP-06168864.*

*Primary Examiner* — Deoram Persaud
(74) *Attorney, Agent, or Firm* — Maschoff Brennan

(57) ABSTRACT

A photomask purging method includes opening a pod having a photomask therein, gripping the photomask by an end effector, moving the end effector from the opened pod to a destination where a gas exit is toward, exhausting a gas from the gas exit toward the gripped photomask, and rotating the end effector with respect to a horizontal plane when the end effector is at the destination where the gas exit is toward.

20 Claims, 14 Drawing Sheets

(56) References Cited

U.S. PATENT DOCUMENTS

| | | | |
|---|---|---|---|
| 2006/0055900 A1* | 3/2006 | Van Der Net | G03F 7/70933 355/30 |
| 2006/0119808 A1* | 6/2006 | Kate | G03F 7/70866 355/30 |
| 2006/0285091 A1* | 12/2006 | Parekh | G02B 27/0006 355/30 |
| 2007/0211232 A1* | 9/2007 | Phillips | G03B 27/52 355/30 |
| 2009/0207394 A1* | 8/2009 | Shibazaki | G03F 7/707 355/53 |
| 2015/0194301 A1* | 7/2015 | Uemura | G03F 7/422 134/18 |
| 2015/0241796 A1* | 8/2015 | Ebert, Jr. | G03F 7/70808 355/30 |
| 2016/0358799 A1* | 12/2016 | Murata | H01L 21/67389 |
| 2017/0271145 A1 | 9/2017 | Dietze et al. | |
| 2017/0309472 A1 | 10/2017 | Hanawa et al. | |
| 2018/0173091 A1* | 6/2018 | Jeong | G03F 1/42 |
| 2019/0049865 A1* | 2/2019 | Kuwahara | G03F 9/7042 |

FOREIGN PATENT DOCUMENTS

| | | | | |
|---|---|---|---|---|
| CN | 106807654 A | | 6/2017 | |
| JP | 06168864 A | * | 6/1994 | |
| JP | 2016031412 A | | 3/2016 | |
| TW | 201617727 A | | 5/2016 | |
| TW | 201624107 A | | 7/2016 | |
| WO | WO-2009023787 A2 | * | 2/2009 | G03F 1/66 |

* cited by examiner

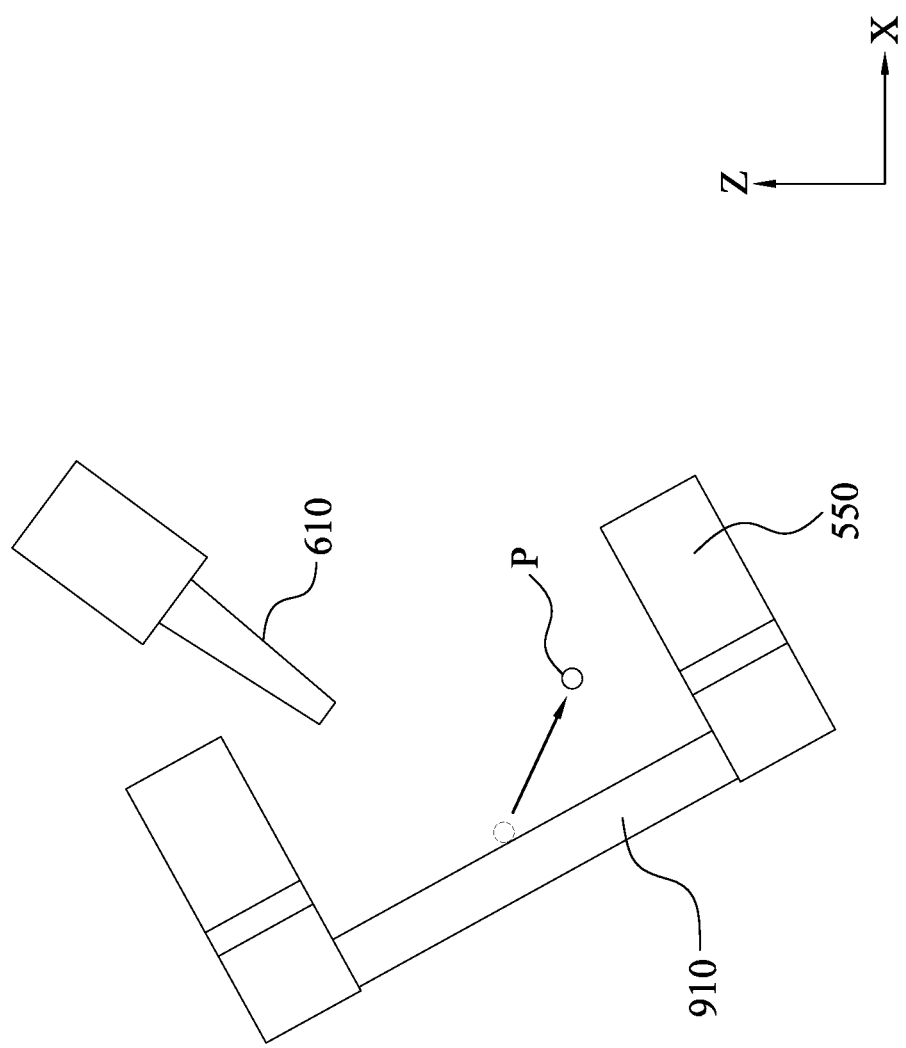

PHOTOMASK PURGING SYSTEM AND METHOD

PRIORITY CLAIM AND CROSS-REFERENCE

This application claims priority to U.S. Provisional Application Ser. No. 62/698,298, filed Jul. 16, 2018, which is herein incorporated by reference.

BACKGROUND

A lithography process is used in a semiconductor device fabrication process whereby the lithography process transfers patterns of photomasks (also referred to as masks or reticles) to a target substrate, typically a semiconductor substrate having a photosensitive layer disposed thereon. If the mask has a defect, the defect is likewise transferred to the target substrate as a defect in the pattern developed onto the substrate. The defect may produce yield, quality, or reliability issues for the resulting semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 8A-8E illustrate exemplary scenarios of purging operations performed when the end effector and the gas exit are at various orientations.

DETAILED DESCRIPTION

Figure 1:
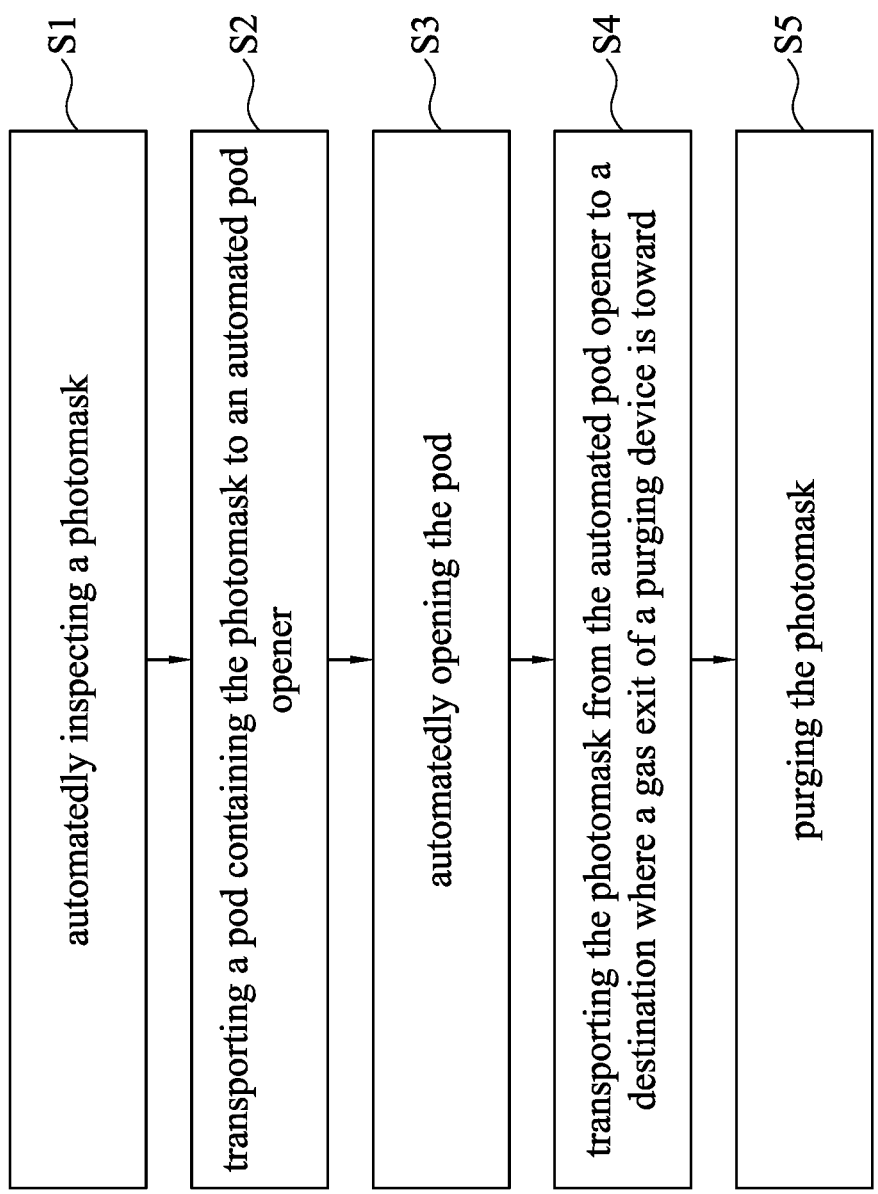
FIG. 1 is a flowchart of a photomask purging method in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Automated material handling system (AMHS) used in the semiconductor fabrication field includes a plurality of bays (rows) of storage areas. Each bay has a stocker, which includes bins for holding a plurality of containers, such as standard mechanical interface (SMIF) containers for loading 200 mm (8 inch) wafers, or front opening unified pods (FOUPs), which may be used to load 300 mm (12 inch) wafers. The stocker holds the SMIFs or FOUPs in preparation for transporting a SMIF or FOUP to the load port of a processing tool. In technologies using larger critical dimensions (CD) and 200 mm wafers, a photomask stocker stores and delivers photomasks for use in photolithographic processes. An overhead hoist transport (OHT) associated with each bay transports the SMIF or FOUP with wafers, or the pod with a photomask, from the respective stocker to a load port for processing in one of the tools (fabrication process machines). However, after transportation or lithography processes, some foreign particles may falls onto the photomask and thus damage the photomask. Therefore, embodiments of the present disclosure provide a cleaning apparatus and method for the photomask.

FIG. 1 is a flowchart of a photomask purging method in accordance with some embodiments. FIGS. 2-6 illustrate the photomask purging method at various stages in accordance with some embodiments. The photomask purging method may be implemented in a fab for fabricating a semiconductor device on a wafer using a photomask. It is understood that additional operations may be implemented before, during, and after the method, and some of the operations may be replaced, eliminated, or moved around for additional embodiments of the method.

Figure 2:
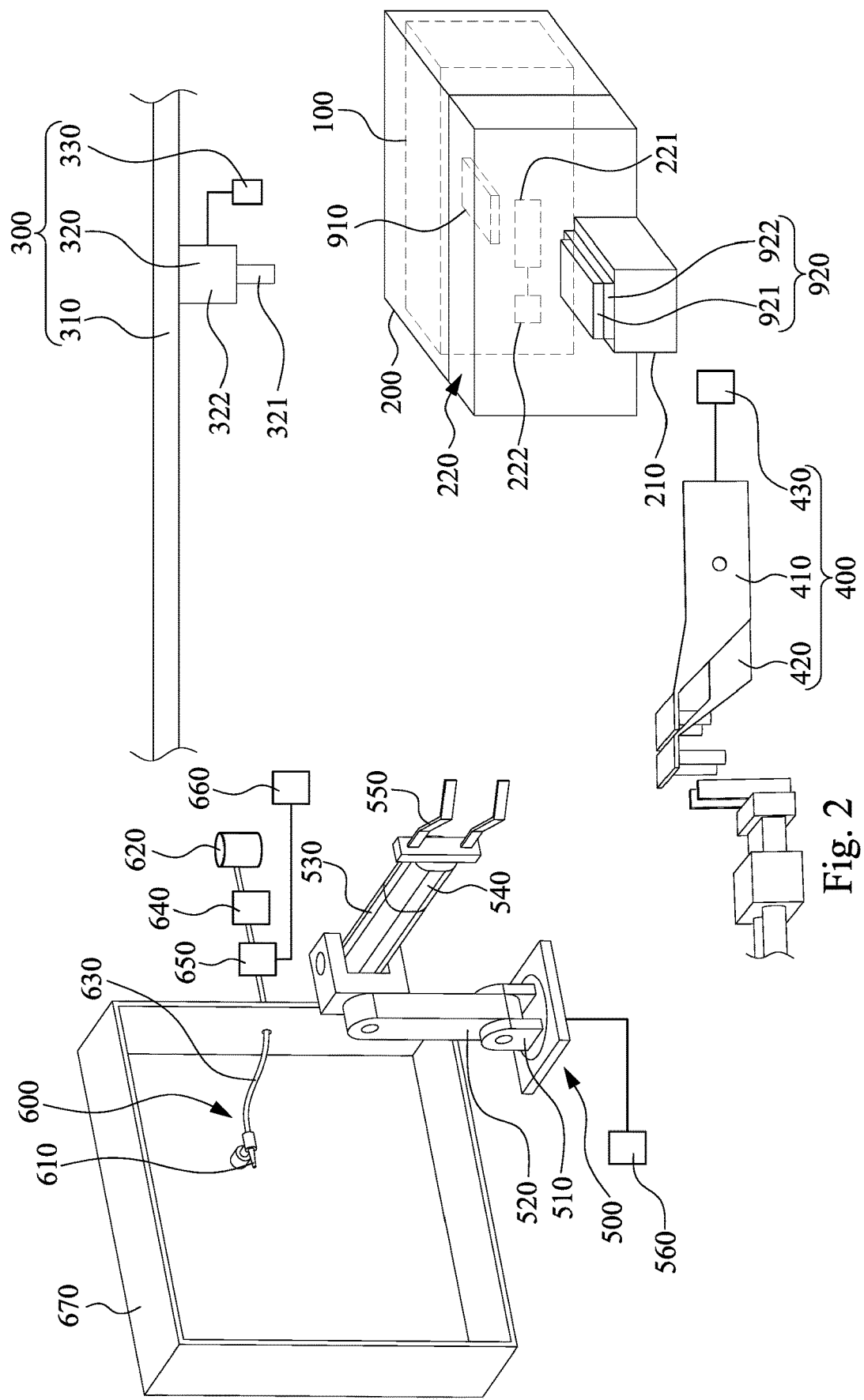
FIGS. 2-6 illustrate the photomask purging method at various stages in accordance with some embodiments of the present disclosure.

The method begins at block S1 where a photomask (or referred to as a reticle or a mask) is automatically inspected. With reference to FIG. 2, in some embodiments, a photomask purging system includes an inspection device 100 capable of inspecting a photomask 910. Inspecting the photomask 910 may be performed inside a lithographic tool, such as a lithographic scanner 200. For example, the lithographic scanner 200 includes a load port 210 and a transfer module 220. The inspection device 100 is accommodated in the lithographic scanner 200. The load port 210 is disposed between an internal space of the lithographic scanner 200 and an exterior external to the lithographic scanner 200. In greater detail, the internal space of the lithographic scanner 200 and the exterior external to the lithographic scanner 200 can be spatially isolated by the load port 210 when a port door of the load port 210 is closed. By using such a configuration, inspection of the photomask 910 is confined in the lithographic scanner 200, which in turn will reduce contaminations to the photomask 910 during the inspection.

In some embodiments, the inspection device 100 includes an illuminator capable of providing illumination (e.g., deep ultra violet (DUV) illumination), a chuck capable of holding the photomask 910, and an image capturing device (e.g., a camera) having a field of view (FOV) covering the chuck. The photomask 910 can be placed on the chuck and scanned using the illuminator, and the resultant radiation can be collected by the image capturing device and then analyzed by a processor to provide a particle map and images associated with suspected particle locations of the photomask 910. In this way, particles on the photomask 910 can automatedly identified. Stated differently, the photomask 910 can be automatically inspected without manual operations.

The transfer module 220 includes a robot arm 221 assigned with a bi-direction transportation path between the load port 210 and the inspection device 100. Stated differently, the transfer module 220 is assigned with a transportation path from the load port 210 to the inspection device 100, and an opposite transportation path from the inspection device 100 to the load port 210. In this way, the transfer module 220 can either transport a photomask 910 from a pod 920 (also called a carrier or a box) placed on the load port 210 to the chuck of the inspection device 100, or transport an inspected photomask 910 from the chuck of the inspection device 100 to the pod 920. The transfer module 220 further includes a controller 222 that is configured to trigger the robot arm 221 to move along the assigned transportation path. In this way, the photomask 910 can be automatedly transported from the inspection device 100 to the pod 920 without manual operations. In some embodiments, the controller 222 may include a processor, a central processing unit (CPU), a multi-processor, a distributed processing system, an application specific integrated circuit (ASIC), or the like.

Figure 3:
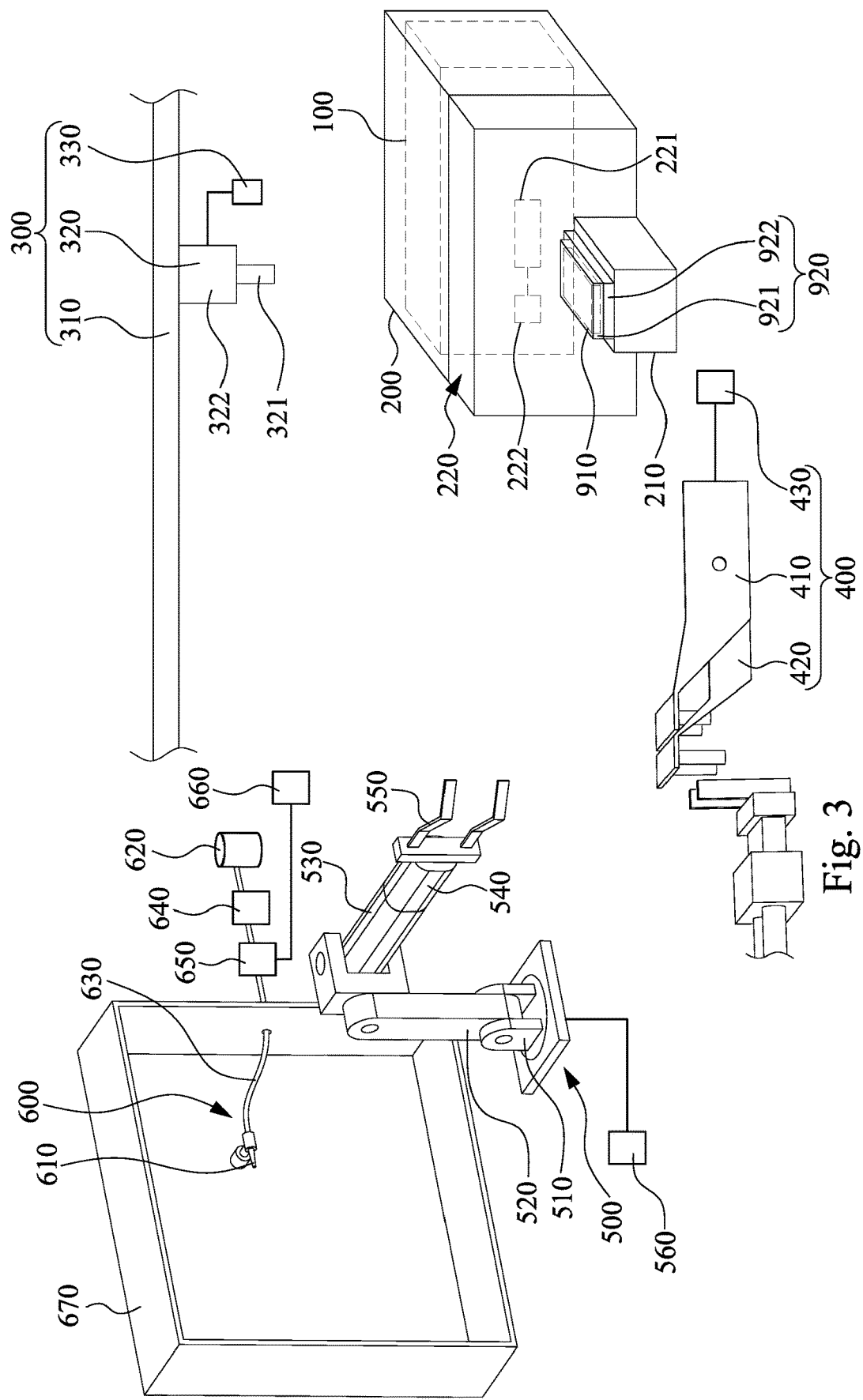
Figure 4:
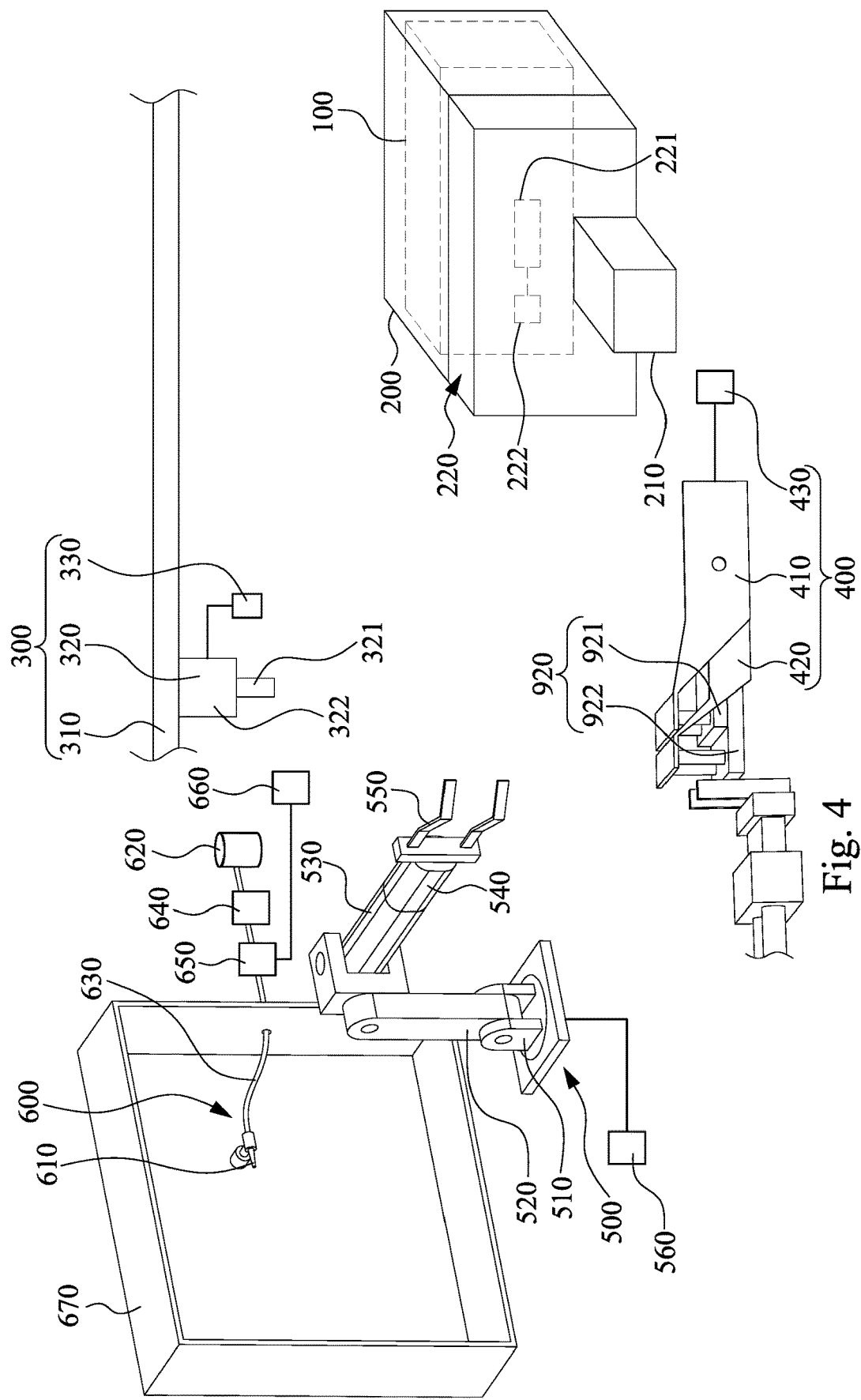

Returning to FIG. 1, the method M then proceeds to block S2 where the photomask is transported to an automated pod opener. With reference to FIGS. 3 and 4, in some embodiments, the photomask purging system further includes an overhead transport (OHT) system 300 and an automated pod opener 400. Transporting the photomask 910 to the automated pod opener 400 includes moving the inspected photomask 910 from the inspection device 100 to the pod 920 placed on the load port 210 using the transfer module 220 in the lithographic scanner 200 (as shown in FIG. 3), and then moving the pod 920 from the load port 210 to the automated pod opener 400 using the OHT system 300 (as shown in FIG. 4). In this way, the transfer module 220 and the OHT system 300 can be in combination referred to as a transporting device assigned with a transportation path from the inspection device 100 to the automated pod opener 400.

In some embodiments, the pod 920 has a lid 921 and a base 922 pivotally connected to the lid 921, so that the lid 921 and the base 922 are rotatable with respect to each other. In some embodiments, the load port 210 is configured to rotate the base 922 with respect to the lid 921, which in turn will open the pod 920 to allow the robot arm 221 of the transfer module 220 to move into the pod 920. In this way, the transfer module 220 can transport the photomask 910 from the inspection device 100 to the pod 920 through the load port 210.

In some embodiments, the OHT system 300 includes a rail 310, an OHT vehicle 320 and a controller 330. In some embodiments, the rail 310 is monorail that is mounted to and suspended from the ceiling and/or walls of a fabrication facility (FAB). The rail 310 may have any suitable cross-sectional configuration so long as the OHT vehicle 320 is appropriately supported from the rail 310 for rolling motion. The OHT vehicle 320 is assigned with a transportation path from the load port 210 to the automated pod opener 400. The transportation or the movement of the OHT vehicle 320 on the rail 310 is triggered by the controller 330. In this way, the pod 920 can be automatedly transported from the load port 210 to the automated pod opener 400 without manual operations. In some embodiments, the controller 330 is in electrical communication with the controller 222 which controls the robot arm 221 in the lithographic scanner 200. The controllers 222 and 330 can be programmed in such a way that the controller 330 triggers the movement of the OHT vehicle 320 after completing transportation of the photomask 910 using the robot arm 221 controlled by the controller 222. This may ensure that the pod 920 transported by the OHT vehicle 320 contains the inspected photomask 910 therein. In some embodiments, the controller 330 may include a processor, a central processing unit (CPU), a multi-processor, a distributed processing system, an application specific integrated circuit (ASIC), or the like.

In some embodiments, the OHT vehicle 320 includes a gripper assembly 321 and a motor-driven or pneumatic hoisting mechanism 322. The hoisting mechanism 322 is operable to vertically raise and lower the gripper assembly 321. The gripper assembly 321 may include one or more retractable and extendable gripper arms having a gripper on the end and configured for locking onto a mating hook or flange on the pod 920.

It is appreciated that while the pod 920 is transported by the OHT vehicle 320, the embodiments of the disclosure should not be limited thereto. The pod 920 can be transported in the FAB by a different mechanism including numerous types of automated and manual vehicles during the manufacturing process. This can include for example automatic guided vehicles (AGVs), personal guided vehicles (PGVs), rail guided vehicles (RGVs), and overhead shuttles (OHSs).

In some embodiments, the automated pod opener 400 includes a first holder 410, a second holder 420 and a controller 430. The first and second holders 410 and 420 are pivotally connected, so that the first and second holders 410 and 420 can rotate with respect to each other. For example, the controller 430 may trigger the first holder 410 to rotate with respect to the second holder 420, and vice versa. In this way, the first and second holders 410 and 420 can be automatedly rotated without manual operations. In some embodiments, the first holder 410 is capable of holding the lid 921 using, for example, a mechanical force or a suction force. Similarly, the second holder 420 is capable of holding the base 922 using a mechanical force or a suction force. In some embodiments, the controller 430 may include a processor, a central processing unit (CPU), a multi-processor, a distributed processing system, an application specific integrated circuit (ASIC), or the like.

Figure 5:
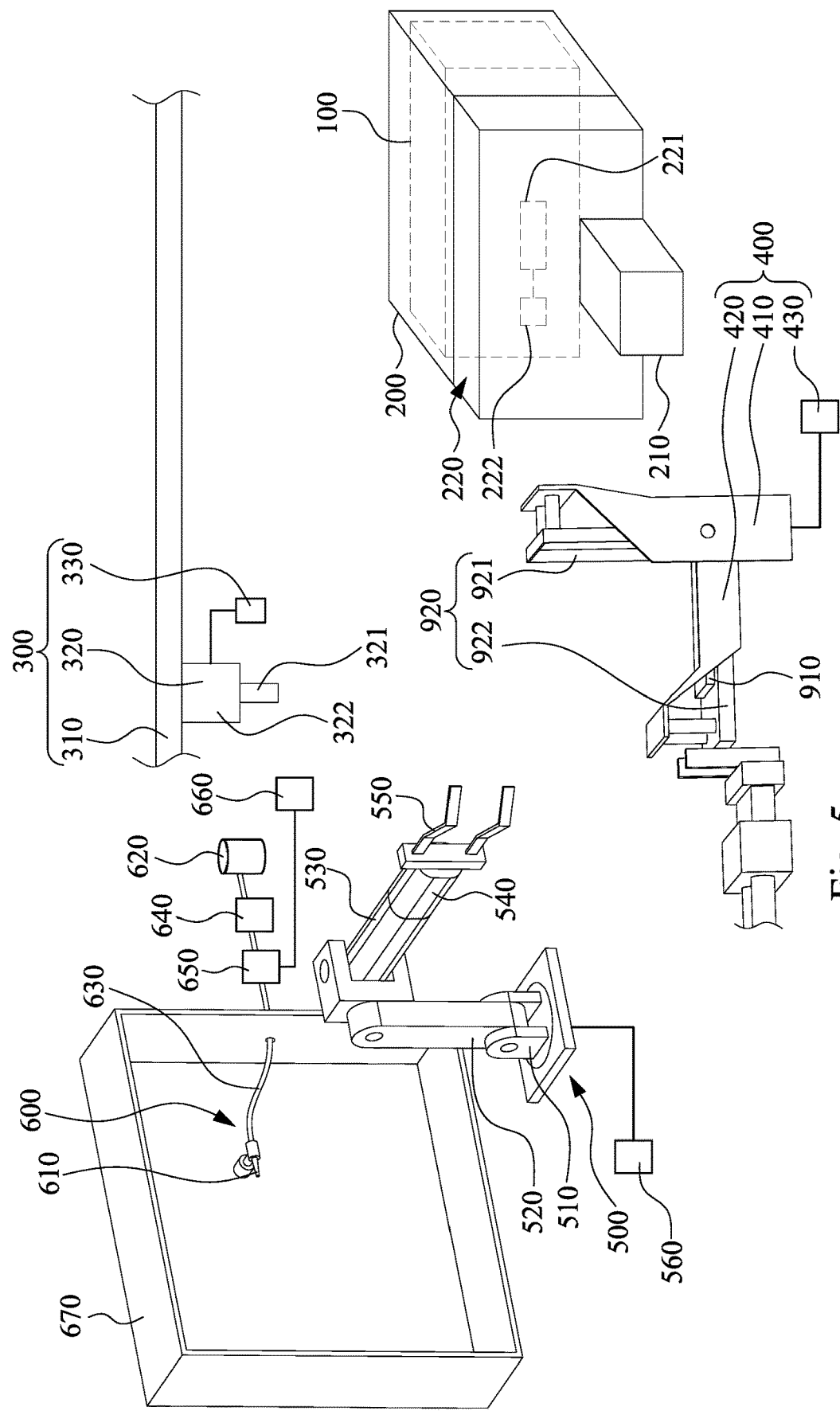

Returning to FIG. 1, the method M then proceeds to block S3 where the pod is automatedly opened. With reference to FIG. 5, in some embodiments, after the first and second holders 410 and 420 respectively hold the lid 921 and the base 922 using the mechanical force or the suction force, the controller 430 triggers the first holder 410 to rotate with respect to the second holder 420, which in turn will rotate the lid 921 with respect to the base 922 to open the pod 920 and thus expose the photomask 910. In this way, the pod 920 can be automatically opened without manual operations. In some embodiments, the controller 430 is in electrical communication with the controller 330 that controls the movement of the OHT vehicle 320. The controllers 330 and 430 can be programmed in such a way that the controller 430 triggers the rotation of the first holder 410 after completing transportation of the pod 920 using the OHT vehicle 320 controlled by the controller 330. This may ensure that rotation of the first holder 410 exactly opens the pod 920.

Figure 6:
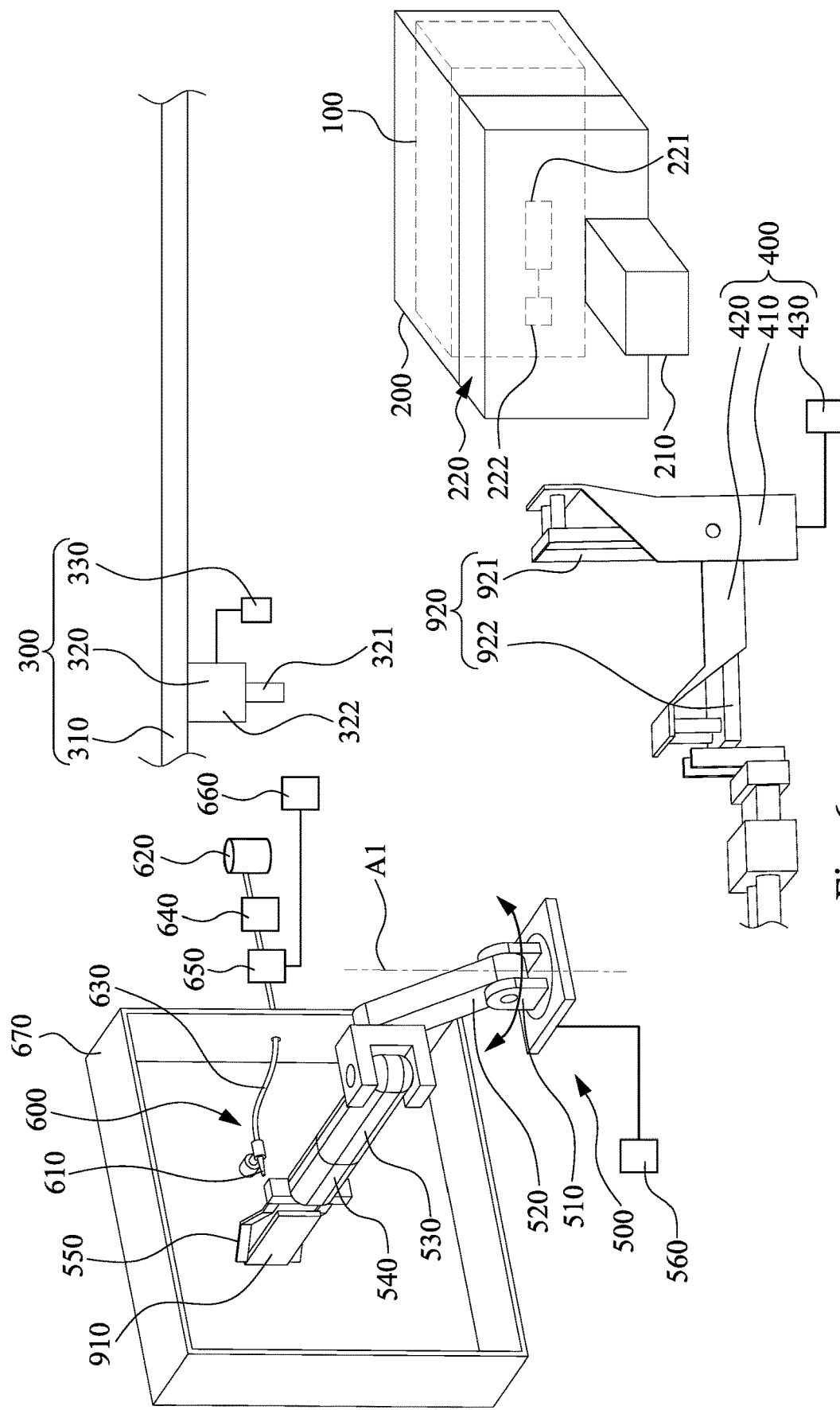

Returning to FIG. 1, the method then proceeds to block S4 where the photomask is transported from the automated pod opener to a destination where a gas exit of a purging device is toward. Afterwards, the method proceeds to block S5 where the photomask is purged. With reference to FIGS. 5 and 6, in some embodiments, the photomask purging system further includes a transporting device 500 and a purging device 600. The transporting device 500 is a robot arm having a range of motion sufficient to transfer the photomask 910 from the automated pod opener 400 to a destination toward which a gas exit 610 of the purging device 600 is. In this way, the photomask 910 can be automatedly transported from the automated pod opener 400 to the place that a purging operation can be performed, and such transportation is achieved without manual operations.

An exemplary robot arm 500 is shown in FIGS. 5 and 6 where the robot arm 500 may include a rotatable base 510, a rotatable arm 520, a rotatable forearm 530, a rotatable wrist member 540, an end effector 550 and a controller 560. Rotations of the base 510, the arm 520, the forearm 530 and the wrist member 540 are controlled by the controller 560 in such a way that the end effector 550 is moved from the automated pod opener 400 to the destination where the gas exit 610 is toward. Stated differently, the transporting device 500 has an end effector 550 assigned with a transportation path from the automated pod opener 400 to the destination toward which the gas exit 610 is, and the transportation path can be achieved by rotations of the base 510, the arm 520, the forearm 530 and the wrist member 540. In some embodiments, the controller 560 may include a processor, a central processing unit (CPU), a multi-processor, a distributed processing system, an application specific integrated circuit (ASIC), or the like.

In some embodiments, the controller 560 is in electrical communication with the controller 430 that controls the pod opening operation of the automated pod opener 400. The controllers 430 and 560 can be programmed in such a way that the controller 560 triggers rotation of the robot arm 500 after the pod 920 is opened using the automated pod opener 400. This may ensure that the robot arm 500 exactly grips the photomask 910 from the opened pod 920.

Figure 7:
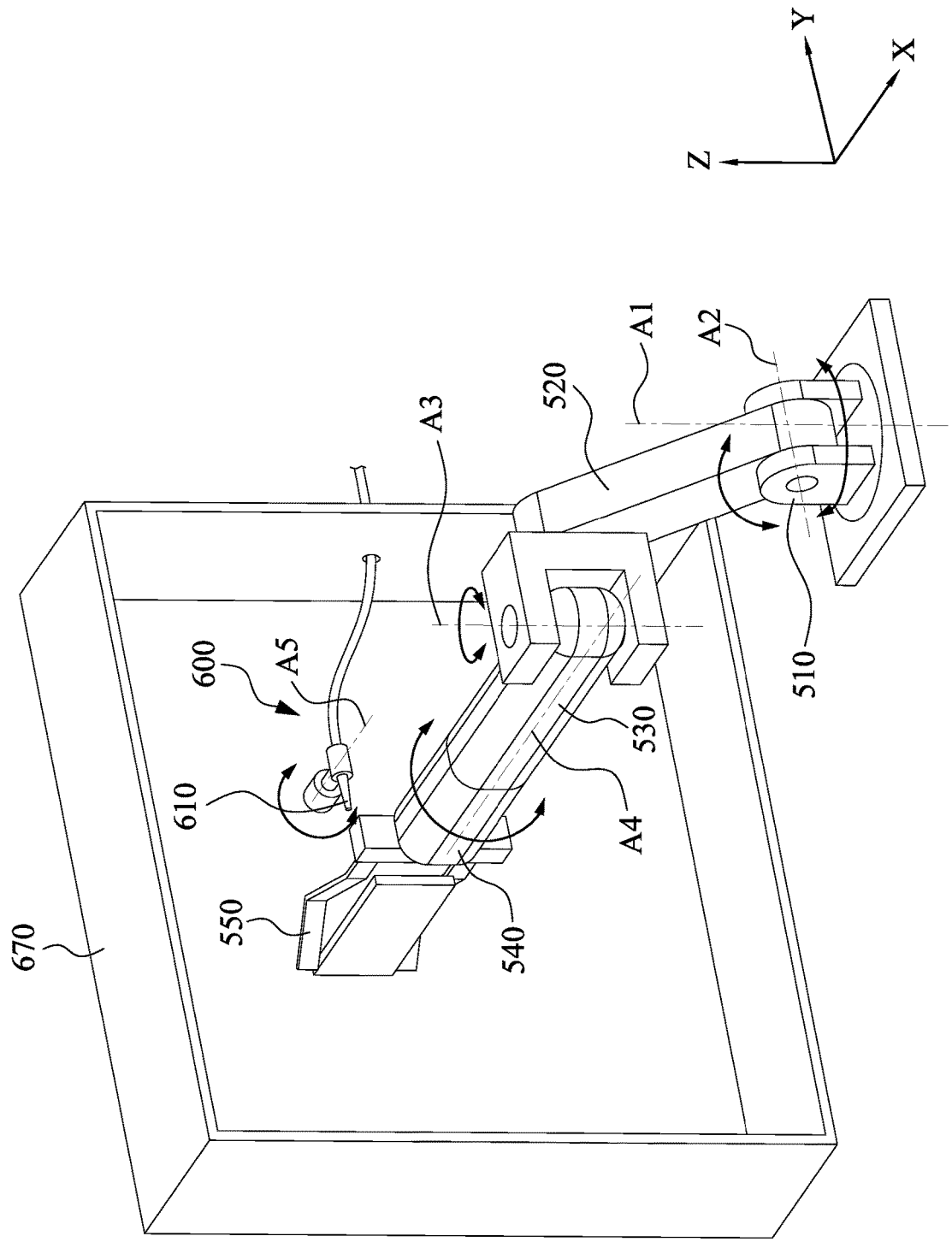
FIG. 7 illustrates example rotation of the robot arm illustrated in FIG. 6.

Example rotation of the robot arm 500 is illustrated in FIG. 7. The base 510 is rotatable about an axis A1 that extends in Z-direction, the arm 520 is rotatable about an axis A2 that extends in Y-direction, the forearm 530 is rotatable about an axis A3 that extends in Z-direction, and the wrist member 540 is rotatable about an axis A4 that extends in X-direction. As illustrated in FIG. 7, X-direction, Y-direction and Z-direction are perpendicular to each other, and hence the end effector 550 can be moved in a three-dimensional manner. In this way, the end effector 550 can be moved to the opened pod 920 to grip the photomask 910, and then, the end effector 550 can be moved from the opened pod 920 to the destination where the gas exit 610 is toward.

In some embodiments, the base 510 of the robot arm 500 is connected to a fixture in the FAB (e.g., floor or ceiling) through a rotational joint or a pivotal joint, which is configured in such a way that the base 510 is rotatable about the Z-directional axis A1. In some embodiments, a first end of the arm 520 is connected to the rotatable base 510 through a rotational joint or a pivotal joint. The joint is configured in such a way that the arm 520 is rotatable about the Y-directional axis A2. In some embodiments, a first end of the forearm 530 is connected to a second end of the arm 520 through a rotational joint or a pivotal joint, which is configured in such a way that the forearm 530 is rotatable about the Z-directional axis A3. In some embodiments, a first end of the wrist member 540 is connected to a second end of the forearm 530 through a rotational joint or a pivotal joint, which is configured in such a way that the wrist member 540 is rotatable about the X-directional axis A4. The end effector 550 is connected to a second end of the wrist member 540 that is farthest away from the first end of the wrist member 540.

Because the wrist member 540 is rotatable about the X-directional axis A4, the end effector 550 connected to the wrist member 540 can be rotated about the X-directional axis A4 as well. In this way, the end effector 550 is rotatable with respect to a horizontal plane (e.g., X-Y plane as shown in FIG. 7) when the end effector 550 is at the destination toward which the gas exit 610 is. As a result, when the purging device 600 blows the photomask 910 held by the end effector 550, the end effector 550 can be rotated with respect to the horizontal plane to an optimized orientation for improving the purging performance. In some embodiments, the end effector 550 is 360-degree rotatable with respect to the horizontal plane. Stated differently, the end effector 550 can be rotated 360 degrees with respect to the horizontal plane.

In some embodiments, the gas exit 610 of the purging device 600 is rotatable about an axis A5 that extends in X-direction. That is, the gas exit 610 is rotatable with respect to the horizontal plane (e.g., X-Y plane as shown in FIG. 7). In this way, the gas exit 610 can be rotated to an orientation associated to the orientation of the end effector 550. In some embodiments, the purging device 600 includes an enclosure 670 that accommodates the gas exit 610, so that the purging operation can be performed inside the enclosure 670. In some embodiments, the gas exit 610 is connected to a wall of the enclosure 670 through a rotational joint or a pivotal joint, which is configured in such a way that the gas exit 610 is rotatable about the X-directional axis A5.

Figure 8A:
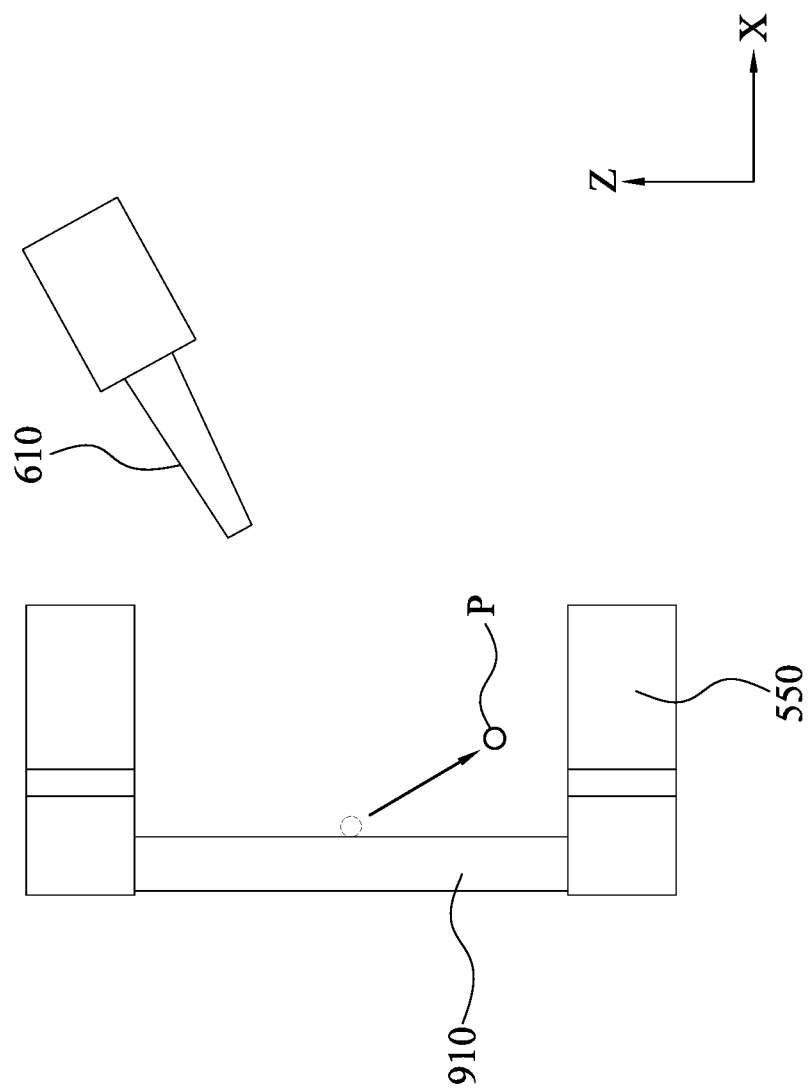

FIGS. 8A-8E illustrate exemplary scenarios of purging operations performed when the end effector 550 and the gas exit 610 are at various orientations. As illustrated in FIG. 8A, the end effector 550 is orientated in such a way that the photomask 910 is substantially perpendicular to the horizontal plane, and the gas exit 610 is orientated toward the vertically oriented photomask 910. The gas exit 610 can thus provide a gas toward the vertically oriented photomask 910, so as to blow particles P away from the photomask 910.

As illustrated in FIG. 8B, the end effector 550 is oriented in such a way that the photomask 910 has an up-slant surface, and the gas exit 610 is orientated toward the up-slant surface of the photomask 910. The gas exit 610 can thus provide a gas toward the up-slant surface of the photomask 910, so as to blow particles P away from the up-slant surface of the photomask 910.

Figure 8C:
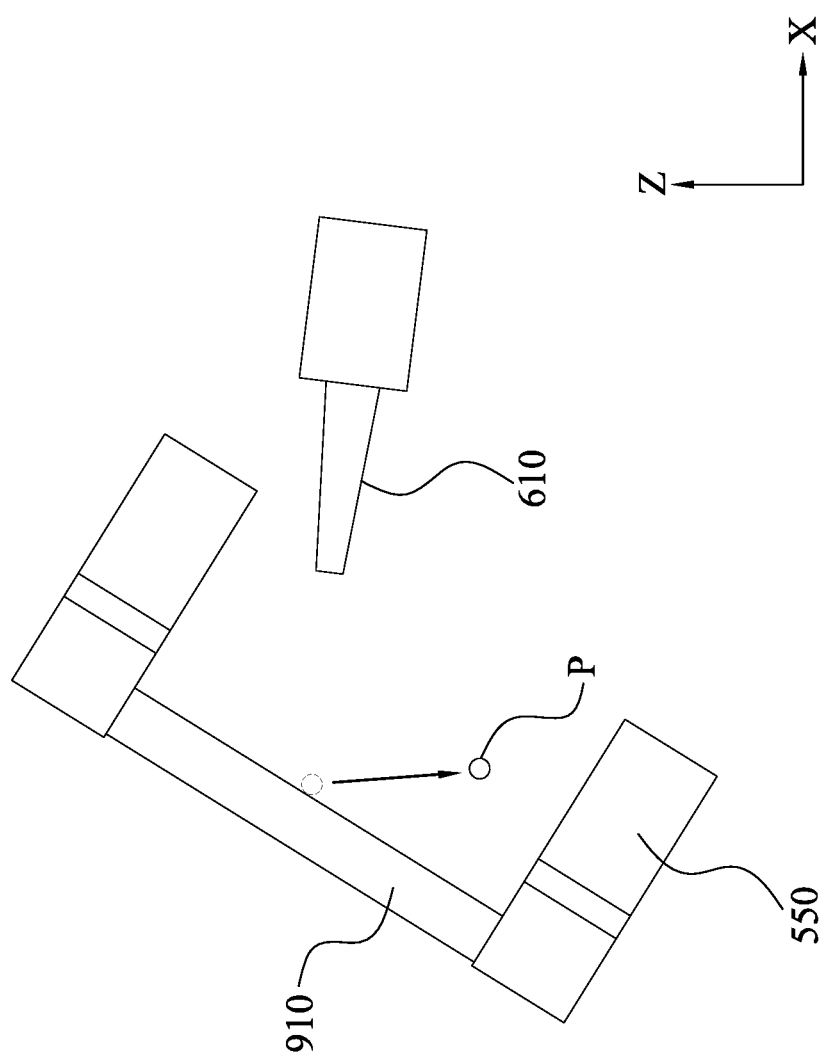

As illustrated in FIG. 8C, the end effector 550 is oriented in such a way that the photomask 910 has a down-slant surface, and the gas exit 610 is orientated toward the down-slant surface of the photomask 910. The gas exit 610 can thus provide a gas toward the down-slant surface of the photomask 910, so as to blow particles P away from the down-slant surface of the photomask 910.

Figure 8D:
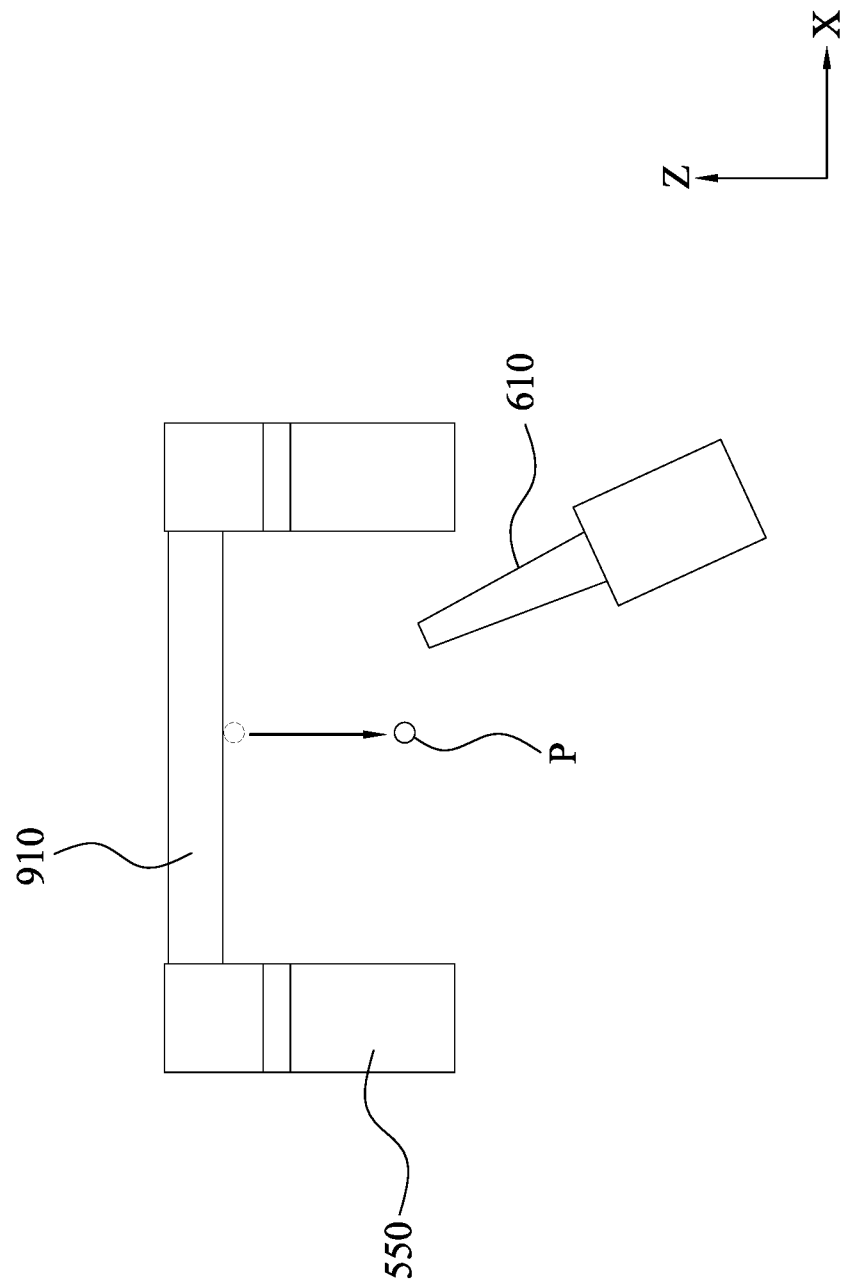

As illustrated in FIG. 8D, the end effector 550 is oriented in such a way that the photomask 910 has a downward facing surface substantially parallel to the horizontally plane, and the gas exit 610 is orientated toward the downward facing surface of the photomask 910. The gas exit 610 can thus provide a gas toward the downward facing surface of the photomask 910, so as to blow particles P away from the downward facing surface of the photomask 910.

Figure 8E:
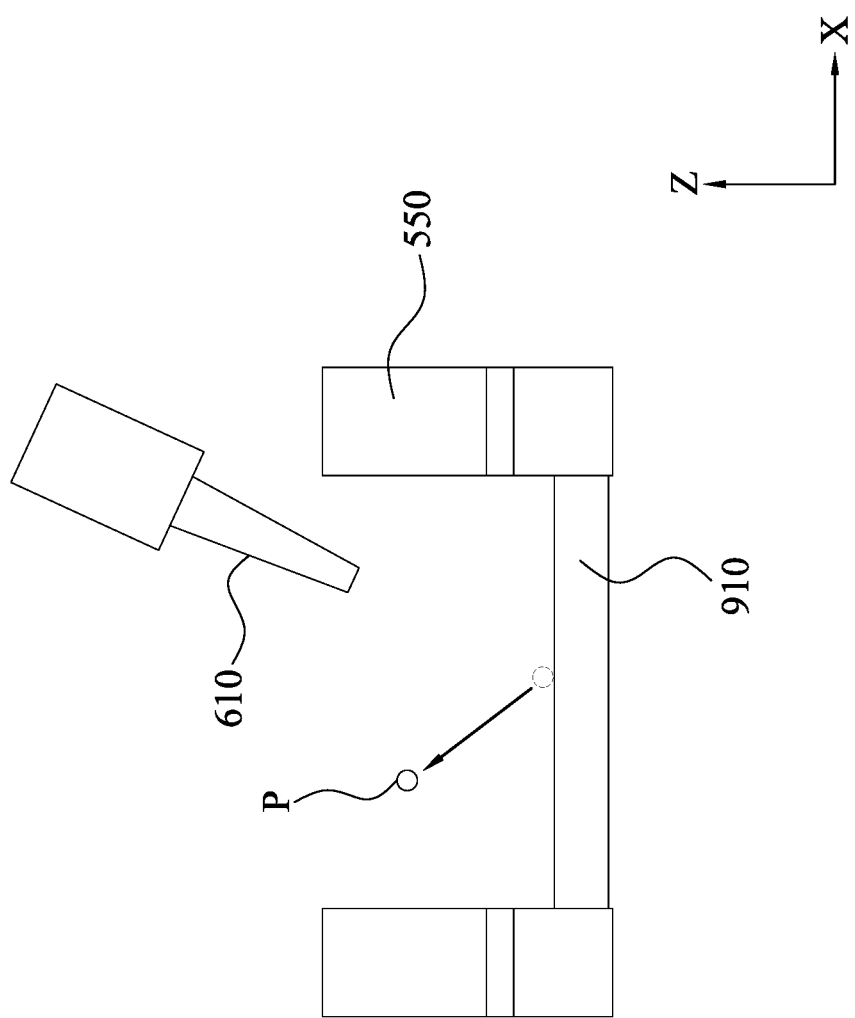

As illustrated in FIG. 8E, the end effector 550 is oriented in such a way that the photomask 910 has an upward facing surface substantially parallel to the horizontally plane, and the gas exit 610 is orientated toward the up facing surface of the photomask 910. The gas exit 610 can thus provide a gas toward the upward facing surface of the photomask 910, so as to blow particles P away from the upward facing surface of the photomask 910.

Returning to FIG. 6, in some embodiments, the purging device 600 further includes a gas source 620. The gas source 620 may be a source of pressurized or compressed nitrogen gas or other suitable gas, such as inert gas, so as to prevent from chemical reaction with the photomask 910. In some embodiments, the purging device 600 may further include a gas line 630. The gas line 630 is connected between the gas exit 610 and the gas source 620. In other words, the gas line 630 can serve as a gas communication path between the gas source 620 and the gas exit 610, so that the gas from the gas source 620 outside the enclosure 670 can be provided to gas exit 610 through the gas line 630. For example, the gas line 630 may extend from an output port (not labeled) of the gas source 620, and the gas exit 610 may be located on an end of the gas line 630 distant from the gas source 620 and located inside the enclosure 670. In some embodiments, the gas line 630 includes a flexible conduit connected with the gas exit 610, so as to allow the gas exit 610 to be oriented to various orientations (e.g., orientations as illustrated in FIGS. 8A-8E) for improving the purging performance. In some embodiments, the gas line 630 is substantially airtight, so as to prevent from gas leakage from the gas line 630.

Figure 9:
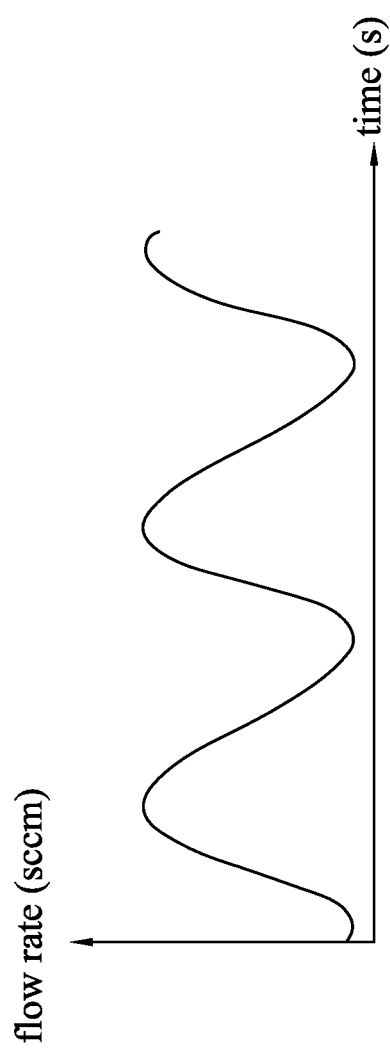
FIG. 9 illustrates an exemplary gas flow rate oscillation in accordance with some embodiments of the present disclosure.

In some embodiments, the purging device 600 further includes a flow rate control valve 640 in the gas line 630 for regulating flow of the gas coming from the gas source 620. Stated differently, the flow rate control valve 640 is in the gas communication path between the gas source 620 and the gas exit 610 to control a flow rate of the gas exhausted from the gas exit 610. In some embodiments, during the purging operation, the flow rate control valve 640 is configured to vary the flow rate of the gas exhausted from the gas exit 610 in an oscillating manner. In other words, the gas exhausted from the gas exit 610 has a periodically variable flow rate. Exemplary gas flow rate oscillation is illustrated in FIG. 9 where the gas flow rate oscillation resembles a substantial sine wave form. Such gas flow rate oscillation will induce resonance of particles on the photomask 910 and thus assist in blowing particles away from the photomask 910, which in turn will improve the purging performance.

In some embodiments, as shown in FIG. 6, the purging device 600 further includes an on/off valve 650 in the gas line 630 and adapted to enable or disable the gas flow from the gas source 620 to the gas exit 610. Stated differently, the on/off valve 650 is in the gas communication path between the gas source 620 and the gas exit 610 and configured to open or shut off the gas communication path, which in turn will result in pulsed gas ejection and thus the improved purging performance. Switching of the on/off valve 650 leads to periodically flowing gas from the gas source 620 the gas exit 610, so that the gas is ejected through the gas exit 610 at specified or predetermined intervals.

Figure 10:
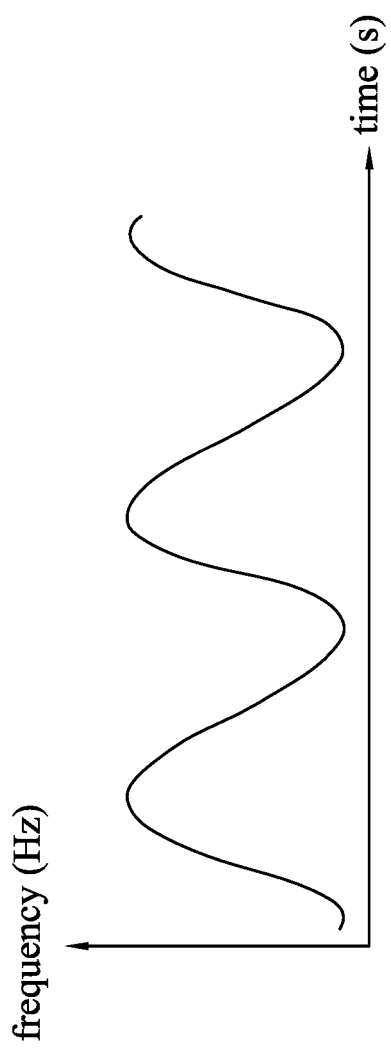
FIG. 10 illustrates an exemplary switch frequency oscillation in accordance with some embodiments of the present disclosure.

In some embodiments, the on/off valve 650 has a variable switch frequency. For example, during the purging operation, the switch frequency of the on/off valve 650 is variable in an oscillating manner. In other words, the on/off valve 650 has a periodically variable switch frequency. Exemplary switch frequency oscillation is illustrated in FIG. 10 where the switch frequency oscillation resembles a substantial sine wave form. Such switch frequency oscillation will result in resonance of particles on the photomask 910 and thus be beneficial in blowing particles away from the photomask 910, which in turn will improve the purging performance.

In some embodiments, the on/off valve 650 is a solenoid valve. In some embodiments, the flow rate control valve 640 is a solenoid valve as well. Although the flow rate control valve 640 and the on/off valve 650 are illustrated as two separate valves in the depicted embodiments, they can be achieved by a single valve in some other embodiments. In some embodiments, the gas flow rate oscillation resulting from the flow rate control valve 640 is associated with the switch frequency oscillation of the on/off valve 650. For example, both the gas flow rate oscillation and the switch frequency oscillation are determined by a resonance frequency of particles on the photomask 910. In this way, either the gas flow rate oscillation or the switch frequency oscillation can be used to induce the resonance of particles on the photomask 910, which in turn will result in an improved purging performance.

In some embodiments, the purging device further includes a controller 660 that is configured to trigger the on/off valve 650 to initiate the pulsed gas ejection. In some embodiments, the controller 660 is in electrical communication with the controller 560 that controls the robot arm 500. The controllers 560 and 660 can be programmed in such a way that the controller 660 triggers the pulsed gas ejection after the photomask 910 is transported to the gas exit 610 using the robot arm 500 controlled by the controller 560. This may ensure that the photomask 910 is purged by the purging device 600. In some embodiments, the controller 660 may include a processor, a central processing unit (CPU), a multi-processor, a distributed processing system, an application specific integrated circuit (ASIC), or the like.

Based on the above discussions, it can be seen that the present disclosure offers advantages. It is understood, however, that other embodiments may offer additional advantages, and not all advantages are necessarily disclosed herein, and that no particular advantages are required for all embodiments. One advantage is that potential contamination resulting from manual operations can be reduced because the purging method involves automated photomask inspection, automated pod opening operation, automated purging operation and automated transportation without manual operations. Another advantage is that the purging performance can be improved because the end effector can be rotated with respect to a horizontal plane, which in turn will orient the photomask to an optimized orientation suitable for blowing particles away from the photomask. Another advantage is that resonance of particles can be induced using a periodically variable gas flow rate and/or a periodically variable switch frequency, which in turn will improve the purging performance.

In some embodiments, a photomask purging method includes opening a pod having a photomask therein, gripping the photomask by an end effector, moving the end effector from the opened pod to a destination where a gas exit is toward, exhausting a gas from the gas exit toward the gripped photomask, and rotating the end effector with respect to a horizontal plane when the end effector is at the destination where the gas exit is toward.

In some embodiments, rotating the end effector is performed during exhausting the gas.

In some embodiments, the photomask purging method further includes rotating the gas exit with respect to the horizontal plane.

In some embodiments, exhausting the gas includes providing the gas from a gas source to the gas exit through a gas line, switching an on/off valve in the gas line at a switch frequency, and varying the switch frequency of the on/off valve.

In some embodiments, varying the switch frequency of the on/off valve is performed such that the switch frequency of the on/off valve is varied in an oscillating manner.

In some embodiments, varying the switch frequency of the on/off valve is performed such that the switch frequency of the on/off valve has a substantially sine waveform.

In some embodiments, the photomask purging method further includes varying a flow rate of the gas exhausted from the gas exit.

In some embodiments, varying the flow rate of the gas is performed such that the flow rate of the gas is varied in an oscillating manner.

In some embodiments, varying the flow rate of the gas is performed such that the flow rate of the gas has a substantially sine waveform.

In some embodiments, wherein opening the pod comprises automatedly opening the pod.

In some embodiments, the photomask purging method further includes automatedly inspecting the photomask prior to opening the pod.

In some embodiments, automatedly inspecting the photomask is performed in a lithographic tool.

In some embodiments, a photomask purging method includes opening a pod having a photomask therein, moving the photomask from the opened pod to a destination where a gas exit is toward, providing a gas from a gas source to the gas exit, and switching an on/off valve connected between the gas source and the gas exit at a time-varying frequency.

In some embodiments, the photomask purging method further includes automatedly detecting locations of particles on the photomask prior to opening the pod.

In some embodiments, the photomask purging method further includes automatedly rotating the photomask with respect to a horizontal plane when the photomask is at the destination where the gas exit is toward.

In some embodiments, a photomask purging system includes an automated pod opener, a robot arm and a purging device. The robot arm has a range of motion sufficient to transfer a photomask from the automated pod opener to a destination. The purging device includes a gas exit, a gas source, a gas line and a flow rate control valve. The gas exit is toward the destination. The gas line connects the gas source and the gas exit. The flow rate control valve is in the gas line and configured to control a gas to flow from the gas source to the gas exit at a periodically variable flow rate.

In some embodiments, the robot arm has an end effector that is 360-degree rotatable with respect to a horizontal plane.

In some embodiments, the flow rate control valve is configured to control the periodically variable flow rate of the gas to have a substantially sine wave waveform.

In some embodiments, the purging device further includes an on/off valve in the gas line. The on/off valve has a periodically variable switch frequency.

In some embodiments, the periodically variable switch frequency of the on/off valve has a substantially sine wave waveform.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A photomask purging method, comprising:
   opening a pod having a photomask therein;
   gripping the photomask by an end effector;
   moving the end effector from the opened pod to a destination where a gas exit is toward;
   exhausting a gas from the gas exit toward the gripped photomask;
   rotating the end effector with respect to a horizontal plane when the end effector is at the destination where the gas exit is toward; and
   rotating the gas exit with respect to the horizontal plane before exhausting the gas from the gas exit is stopped.

2. The photomask purging method of claim 1, wherein rotating the end effector is performed during exhausting the gas.

3. The photomask purging method of claim 1, wherein exhausting the gas comprises:
   providing the gas from a gas source to the gas exit through a gas line;
   switching an on/off valve in the gas line at a switch frequency; and
   varying the switch frequency of the on/off valve.

4. The photomask purging method of claim 3, wherein varying the switch frequency of the on/off valve is performed such that the switch frequency of the on/off valve is varied in an oscillating manner.

5. The photomask purging method of claim 3, wherein varying the switch frequency of the on/off valve is performed such that the switch frequency of the on/off valve has a substantially sine waveform.

6. The photomask purging method of claim 1, further comprising:
   varying a flow rate of the gas exhausted from the gas exit.

7. The photomask purging method of claim 6, wherein varying the flow rate of the gas is performed such that the flow rate of the gas is varied in an oscillating manner.

8. The photomask purging method of claim 6, wherein varying the flow rate of the gas is performed such that the flow rate of the gas has a substantially sine waveform.

9. The photomask purging method of claim 1, wherein opening the pod comprises automatedly opening the pod.

10. The photomask purging method of claim 1, further comprising:
    automatedly inspecting the photomask prior to opening the pod.

11. The photomask purging method of claim 10, wherein automatedly inspecting the photomask is performed in a lithographic tool.

12. The photomask purging method of claim 1, wherein the end effector is rotated such that the gripped photomask is tilted with respect to the horizontal plane, and the gas exit is rotated such that the gas exit is oriented toward the tilted photomask.

13. A photomask purging method, comprising:
    opening a pod having a photomask therein;
    moving the photomask from the opened pod to a destination where a gas exit is toward;
    providing a gas from a gas source to the gas exit; and
    switching an on/off valve connected between the gas source and the gas exit at a switch frequency, wherein the switch frequency of the on/off valve changes in a sine function.

14. The photomask purging method of claim 13, further comprising:
   automatedly detecting locations of particles on the photomask prior to opening the pod.

15. The photomask purging method of claim 13, further comprising:
   automatedly rotating the photomask with respect to a horizontal plane when the photomask is at the destination where the gas exit is toward.

16. The photomask purging method of claim 13, further comprising:
   rotating the photomask after the photomask is moved to the destination where the gas exit is toward; and
   rotating the gas exit after rotating the photomask.

17. A photomask purging system, comprising:
   an automated pod opener;
   a robot arm having a range of motion sufficient to transfer a photomask from the automated pod opener to a destination; and
   a purging device comprising:
      a gas exit toward the destination;
      a gas source;
      a gas line connecting the gas source and the gas exit; and
      a flow rate control valve in the gas line, wherein the flow rate control valve is configured to control a gas to flow from the gas source to the gas exit at a periodically variable flow rate, wherein the periodically variable flow rate changes in a sine function.

18. The photomask purging system of claim 17, wherein the robot arm has an end effector that is 360-degree rotatable with respect to a horizontal plane.

19. The photomask purging system of claim 17, wherein the purging device further comprises:
   an on/off valve in the gas line, wherein the on/off valve has a periodically variable switch frequency.

20. The photomask purging system of claim 19, wherein the periodically variable switch frequency of the on/off valve has a substantially sine wave waveform.

* * * * *